(12) United States Patent
Leggett et al.

(10) Patent No.: US 7,787,504 B2
(45) Date of Patent: Aug. 31, 2010

(54) OPTICAL SUPPLY ARRANGEMENT

(75) Inventors: Derek Nigel Leggett, Winchester (GB); James McInnes, Winchester (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 1389 days.

(21) Appl. No.: 10/181,097

(22) PCT Filed: Jan. 12, 2001

(86) PCT No.: PCT/GB01/00117

§ 371 (c)(1),
(2), (4) Date: Nov. 15, 2002

(87) PCT Pub. No.: WO01/52365

PCT Pub. Date: Jul. 19, 2001

(65) Prior Publication Data
US 2003/0103536 A1 Jun. 5, 2003

(30) Foreign Application Priority Data
Jan. 13, 2000 (GB) .................................. 0000583.5

(51) Int. Cl.
*H01S 3/13* (2006.01)
(52) U.S. Cl. .............. 372/29.02; 372/43.01; 372/38.09; 372/38.01; 372/38.02
(58) Field of Classification Search ............. 372/29.02, 372/43–50, 29.014, 50.1, 38.09, 38.01, 38.02
See application file for complete search history.

(56) References Cited

U.S. PATENT DOCUMENTS

| | | | | |
|---|---|---|---|---|
| 4,812,641 A | * | 3/1989 | Ortiz, Jr. ...................... 250/205 |
| 4,951,288 A | * | 8/1990 | Barton et al. ................. 372/33 |
| 5,291,326 A | * | 3/1994 | Heidemann ................... 398/33 |
| 5,737,105 A | * | 4/1998 | Ohta et al. .................... 398/18 |
| 6,160,568 A | * | 12/2000 | Brodsky et al. ............. 347/247 |
| 6,215,801 B1 | * | 4/2001 | Ackerman et al. ............ 372/32 |
| 6,275,516 B1 | * | 8/2001 | Arney et al. ................... 372/71 |
| 6,389,046 B1 | * | 5/2002 | Stayt et al. ............... 372/29.02 |

(Continued)

*Primary Examiner*—Minsun Harvey
*Assistant Examiner*—Delma R Forde
(74) *Attorney, Agent, or Firm*—Brandon S. Clark; Rodney Warfford

(57) ABSTRACT

In an optical supply arrangement, a laser source (10) provides transmitted laser light down an optical supply line (12, 14). A first coupler (16), remote from the laser source (10) along the optical supply line (14), taps off a small proportion of the transmitted laser light to be returned along the optical supply line (14) to a photo detector (26) driving a monitor (28) and a controller (30). If the monitor (28) detects that the photo detector (26) is experiencing a loss of return laser light, possibly due to a break in the optical supply line (14), the monitor (28) causes the controller (30) to extinguish the laser source (10) in less time than escaping laser light can cause damage to property, person or eyesight. A first embodiment has the transmitted light on a transmission fiber optic (12) and the return laser light on a separate return fiber optic (24). A second embodiment has the return laser light being sent back down the transmission fiber optic (12). A reflective key (42, 22), monochromatic to the wavelength of the laser source, is selectably removable to disable the laser source (10) for maintenance or conditional access. The monitor (28) can operate on absolute levels, averages or rates of change to establish if a loss of transmission has occurred.

15 Claims, 4 Drawing Sheets

U.S. PATENT DOCUMENTS 7,154,922 B2 * 12/2006 Hattori .................... 372/29.01
2001/0038488 A1 * 11/2001 Kinoshita .............. 359/341.41
2003/0043862 A1 * 3/2003 Jacobowitz et al. ........... 372/20
2006/0198017 A1 * 9/2006 Inagaki et al. ............... 359/337

* cited by examiner

OPTICAL SUPPLY ARRANGEMENT

The present invention relates to the safety of laser light sources, The invention particularly relates to laser light sources providing radiant energy along an optical supply line. The invention, most particularly, relates to an optical supply arrangement arranged to extinguish a source of laser light in the event of a break in an optical supply line.

One object of the invention is protection against accidental failure in an optical supply line. Another object of the invention is improved safety during maintenance. A further object of the invention is conditional operability of laser equipment.

In the past, when lasers were rare and novel, their use was largely restricted to specialist applications, under the control of experts who, as a matter of course and knowledge, took every precaution for their own safety. Lasers have now become commonplace, and under the control of non-experts in an everyday work situation. A considerable potential health and safety problem is the result.

Laser light sources, in combination with an optical supply line, typically a fibre optic line, have found wide and increasing utility in communications, industry, defense and medicine for purposes as varied as machining, medical treatment, surgery, communications, and parameter (e.g. temperature) measurements. It is known, for example, in the oil industry, to supply high-powered laser light along a fibre-optic cable to communicate with, control and/or power a remote device, at or in an oil well. These are just some of the many uses of a combination of a powerful laser light source and a supply line to direct the laser light to its intended point of application.

However, a considerable safety risk exists where high-powered laser light is transmitted along an optical supply line. Supply lines can fracture or break, interrupting the continuity of the transmission of the laser light and, very probably, permitting escape of laser light in unpredictable quantities and directions. Any escaping light from an accidental break in the supply line has the potential to cause damage to property or injury to personnel by virtue, in many high energy applications, of the sheer amount of concentrated energy to be found in the coherent laser beam. The present invention seeks to provide means to prevent the possibility of escape of damaging amounts of laser light energy.

Even in laser applications where the energy concentration is relatively low, there is still a very considerable risk to human sight. The human eye has the property of focusing incident light onto the retina. It takes a remarkably small amount of coherent light, focused on the retina, to cause serious injury. It does not particularly matter whether or not the incident laser beam is within the spectrum of sight. The damage will still be done. For example, it is known that irreparable eye damage may be suffered by exposure to a low power 1500 nanometer laser source for more than three milliseconds. The exact maximum exposure time, before irreparable injury occurs, is a decreasing function of the power of the laser source and also varies with its wavelength. The example quoted gives an indication of the rapidity with which even the smallest laser light source can cause irreversible damage.

In the past, band stop filter goggles were used. These block the wavelength of light emitted by the laser. Users are prone to ignore goggles, more likely in workplace situations than in a laboratory. Goggles are only proof against one wavelength, making different goggles necessary for different lasers. Multiple lasers, using a multiplicity of wavelengths, transmitted down one optical fibre, have been employed in communications and other applications. No one set of goggles can be proof against a multiplicity of wavelengths. Goggles have a maximum incident power intensity beyond which they are ineffective. Scattering can occur from the frame of the goggles, causing light to enter the eye. Goggles have their limitations. The present invention seeks to provide fundamental protection against accidental laser eye damage superior to and independent of prior solutions.

Maintenance on laser equipment, or equipment associated with lasers, can be hazardous. As an example, an optical supply line, as used in the oil industry, can stretch many hundreds (or even thousands) of meters away from the laser light source. While the laser light source may have operable electrical interlocks to prevent its operation, these can be overridden. Maintenance personnel, operating remotely along and upon the supply line, are exposed to the risk of unintentional activation of the laser light source. The present invention seeks to provide means whereby a laser light source may positively and definitively be disabled during maintenance.

In some situations, it is desirable to permit only authorised use of laser equipment. The present invention seeks to provide means whereby use of laser equipment may be made dependent upon the user having correct authorisation.

According to a first aspect, the present invention consists in an optical supply system comprising: optical supply line means for guidance of transmitted laser light from a laser source; photo detector means, coupled to monitor the intensity of transmitted laser light in said supply line means and responsive thereto to provide output indicative thereof; monitoring means, coupled to receive said output of said photo detector means and responsive thereto to provide output indicative of loss of transmission of transmitted laser light in said supply line means; and control means, coupled to receive said output of said monitoring means and responsive thereto to extinguish the laser source.

According to a second aspect, the present invention consists in an optical supply apparatus comprising: a laser source; optical supply line means for guidance of transmitted laser light from said laser source; photo detector means, coupled to monitor the intensity of transmitted laser light in said supply line means and responsive thereto to provide output indicative thereof; monitoring means, coupled to receive said output of said photo detector means and responsive thereto to provide output indicative of loss of transmission of transmitted laser light in said supply line means; and said laser source comprising control means, coupled to receive said output of said monitoring means and responsive thereto to extinguish said laser source.

According to a third aspect, the present invention consists in a removable key, for use in an optical supply system including: optical supply line means for guidance of transmitted laser light from a laser source; coupling means comprising return optical path means for providing light from a coupling position on said supply line means to photo detector means for monitoring the intensity of transmitted laser light in the supply line means and responding thereto to provide output indicative thereof; monitoring means, coupled to receive the output of the photo detector means and responsive thereto to provide output indicative of loss of transmission of transmitted laser light in the supply line means; and control means, coupled to receive the output of the monitoring means and responsive thereto to extinguish the laser source, said key being selectably operable, on insertion into said return light path means, to enable said provision of light to said photo detector means, and, on removal from said return path means, to break said provision of light to said photo detector means.

According to a fourth aspect, the present invention consists in a method for controlling transmitting laser light, from a laser source, along a supply line, said method including the steps of: measuring the intensity of transmitted laser light in said supply line; monitoring said measured intensity of laser light in said supply line for indication of a loss of transmission of laser light in said supply line; and extinguishing said laser source in the event of said indication of loss of transmission.

The first and second aspects of the invention provide that the photo detector can comprise an optical coupling, interactive with the supply line, at a coupling position remote from the laser source.

The first and second aspects of the invention, further, provide that the optical coupling can comprise a return optical path for providing light from the coupling position to said photo detector means.

The first and second aspects of the invention, further, provide that the return optical path can be included in the supply line.

The first and second aspects of the invention further provide that the supply line can comprise a transmission fibre optic for guidance of transmitted laser light from the laser source, and that the return optical path can include either said transmission fibre optic or a return fibre optic.

The first and second aspects of the invention further provide that the return path can be provisive of light to the photo detector only at a predetermined wavelength.

The first and second aspects of the invention further provide that return optical path can comprise interruption means, selectably operable either to interrupt or to enable provision of light to the photo detector.

The first and second aspects of the invention further provide that the interruption means can comprise a reflector for directing passage of laser light in the return optical path and that the reflector means can be reflective only at the predetermined wavelength of laser light.

The first and second aspects of the invention further provide that reflector can comprise an optical filter, transmissive of laser light only at the predetermined wavelength.

The first and second aspects of the invention further provide that the interruption means is a removable key.

The first and second aspects of the invention, further, provide that the predetermined wavelength is the wavelength of transmitted light from the laser source.

The first and second aspects of the invention further provide that the reflector can comprise a Bragg grating.

The first and second aspects of the invention further provide that the monitoring means can be operative to provide output, indicative of loss of transmission of transmitted laser light in the supply line, if the output of the photo detector is indicative of transmitted laser light in the supply line having fallen below a predetermined level, having fallen below a predetermined proportion of its mean level, or having fallen in intensity at more than a predetermined rate.

The first and second aspects of the invention further provide that the control means can be operative to cause removal of activating power from the laser source, and that the activating power can be electrical power.

The third aspect of the invention further provides that the key can be operable to provide passage of light along the return path only at a predetermined wavelength, that the key can comprise a reflector for directing passage of laser light in the return optical path, and that the reflector can be reflective only at the predetermined wavelength of laser light.

The third aspect of the invention further provides that the reflector can comprise an optical filter, transmissive of laser light only at said predetermined wavelength, and/or a Bragg grating, reflective at the predetermined frequency, The third aspect of the invention further provides that the predetermined wavelength can be the wavelength of transmitted light from the laser source, and that the key can comprising an optical filter, permissive of through passage of light only at the predetermined wavelength.

The fourth aspect of the invention further provides a method wherein the step of measuring the intensity of transmitted laser light in the supply line can include the step of coupling a portion of transmitted laser light, from the supply line, via a return optical path.

The fourth aspect of the invention further provides a method including the step of selectably interrupting or completing the return optical path respectively to extinguish the laser source or to enable operation of the laser source.

The fourth aspect of the invention further provides a method including the steps of: employing a transmission fibre optic for guidance of transmitted laser light from laser source; and either employing the transmission fibre optic as at least part of the return optical path, or employing a return fibre optic in the return optical path.

The fourth aspect of the invention further provides a method, including the step of permitting the return optical path to allow passage of light only at a predetermined wavelength.

The fourth aspect of the invention further provides a method, including the step of employing removable reflector means in the return path for interrupting or completing the optical return path.

The fourth aspect of the invention further provides a method, including the steps of employing removable reflector means which are reflective only at the predetermined wavelength, of employing a Bragg grating and/or an optical filter, transmissive of light only at the predetermined wavelength, in the removable reflector, The fourth aspect of the invention further provides a method, including the step of providing the removable interruption means in the form of a removable key.

The fourth aspect of the invention further provides a method, including the step of employing, as the predetermined wavelength, the wavelength of laser light from the laser source The invention, in its various aspects, thus allows that any cessation or disruption in the optical supply line between the source of laser light and the point of coupling of the photo detector will cause the source of laser light to be extinguished, thereby eliminating the risk of damage or injury which might otherwise result from the sustained emission of laser light at the break. The invention also allows sure de-activation of the laser source for maintenance or for controlling access to operate.

The invention is further explained, by way of example, by the following description, taken in conjunction with the appended drawings, in which.

Figure 1:
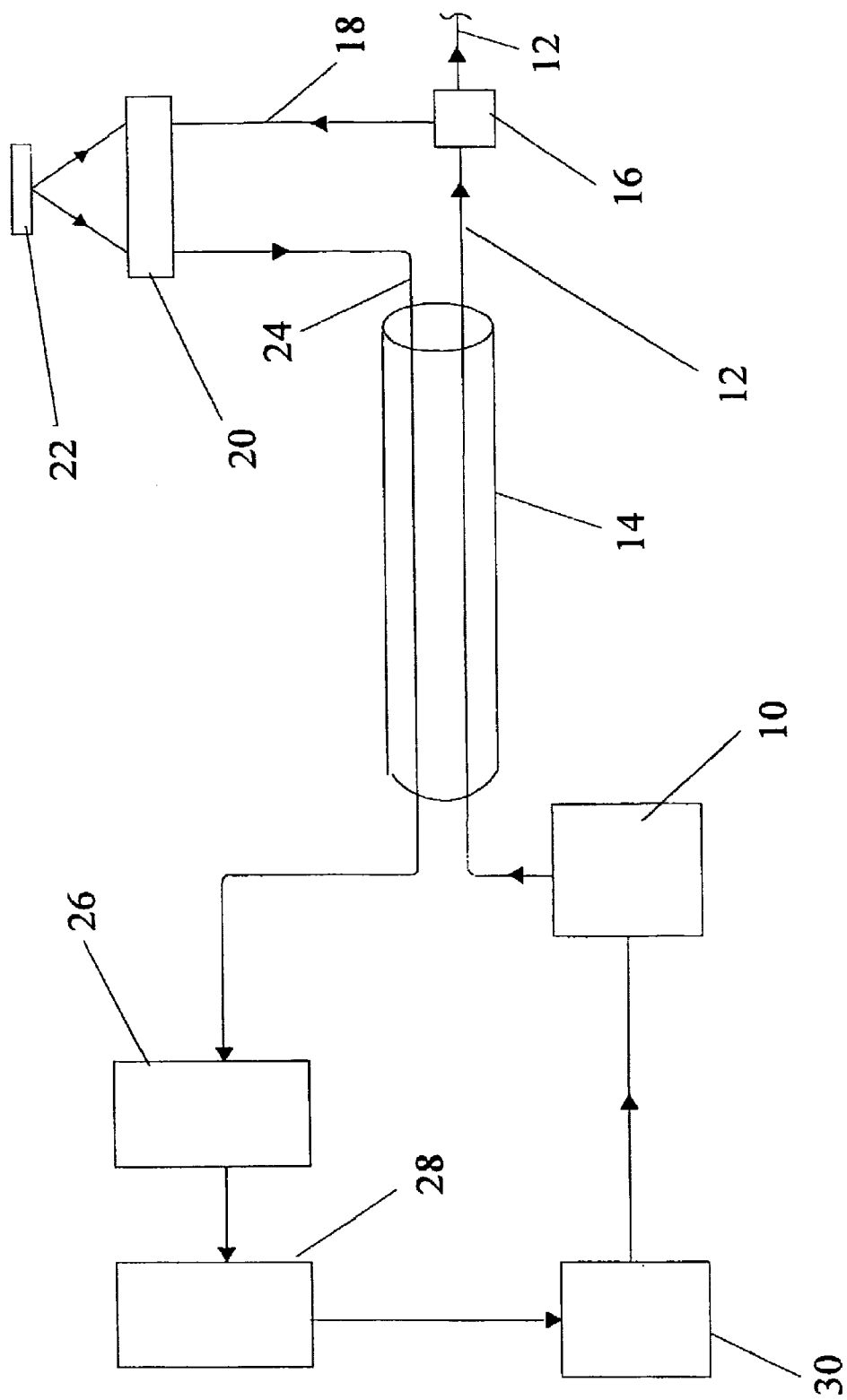
FIG. 1 is a schematic diagram of a first embodiment of the invention, incorporation a removable reflective key, a transmission fibre optic and a return fibre optic.

Attention is first drawn to FIG. 1. A laser source 10 provides transmitted laser light down a transmission fibre optic which forms part of an optical supply line 14 in the form of a bundled cable. A first coupler 16, on the transmission fibre optic 12, at a coupling point remote along the supply line 14 from the laser source 10, taps off a small portion of the laser light from the laser source 10. For preference, the first coupler 16 taps off less than about 0.1% and suitably in the region of 0.04% of the total transmitted laser light to give, in this instance, a preferred value of around 60 microwatts of return laser light, which is provided down a first coupling fibre optic 18 to a second coupler 20. The second coupler 20 projects the return laser light onto a reflector 22, and the reflector 22 provides the return laser light back to the second coupler 20 and thence to a return fibre optic 24, which, for preference, is also incorporated as part of the supply line 14. The return fibre optic 24, at its laser source 10 end then provides the return laser light to a photo detector 26 which provides an electrical signal, to a monitor 28, representative of the value of the return laser light.

The monitor 28 continuously monitors the output of the photo detector 26. If the output of the photo detector 26 drops, possibly indicating a loss of transmission of transmitted laser light down the transmission fibre optic 12, and possibly occasioned by a break or fracture in the supply line 14, the monitor provides a signal, indicating it has detected the drop, to a controller 30. The controller 30 is coupled to the laser source 10 and, in response to the monitor detecting a drop, the controller shuts down the laser source 10, extinguishing the laser source 10.

As will later be explained with reference to FIG. 6, the monitor 28 can have several criteria for detecting a loss of transmission of laser light including falling below an absolute level, falling to below a predetermined proportion of its mean value, or falling too fast.

The controller 30, for preference, extinguishes the laser source by shutting down a low time constant portion of the laser power supply, most appropriate for fast gas and solid state lasers. Other alternatives are possible, including Q-spoiling, optical switching, switching off a pump source, or even interposing a mechanical shutter. Any or all of these techniques can be used alone or in combination. The important element, for the present invention, is that the laser source 10 should be cease to transmit laser light along the transmission fibre optic 12 within a time too short for any escaping transmitted laser light to cause damage to personnel or property.

For preference, the photo detector 26 comprises a photo voltaic cell, such as a silicon photocell, and associated amplifiers. Other devices can be used, such as photo diodes, photo transistors, photo resistance cells, and so on. The important element, as far as the present invention is concerned, is that the photosensitive element is fast enough (has sufficient bandwidth) to cause the monitor 28 and the controller 30 to shut down the laser source within the required time period, and that the photo sensitive element is sensitive and stable enough to detect the return laser light without problems.

For preference, the photo detector 26 is provided with an optical filter, matching the wavelength of the laser source 10, preventing light of any other wavelength entering therein. This prevents extraneous light spuriously producing a false "hold on" signal, with potentially disastrous consequences.

The laser source 10 can also be extinguished if any other part of the return optical path 16 18 20 22 20 24 should accidentally fail, be interrupted or be broken. This feature of the invention represents a "fail safe" aspect which, in conjunction with the description surrounding FIGS. 3, 4 and 5, will be shown to be of advantage over the prior art.

Figure 2:
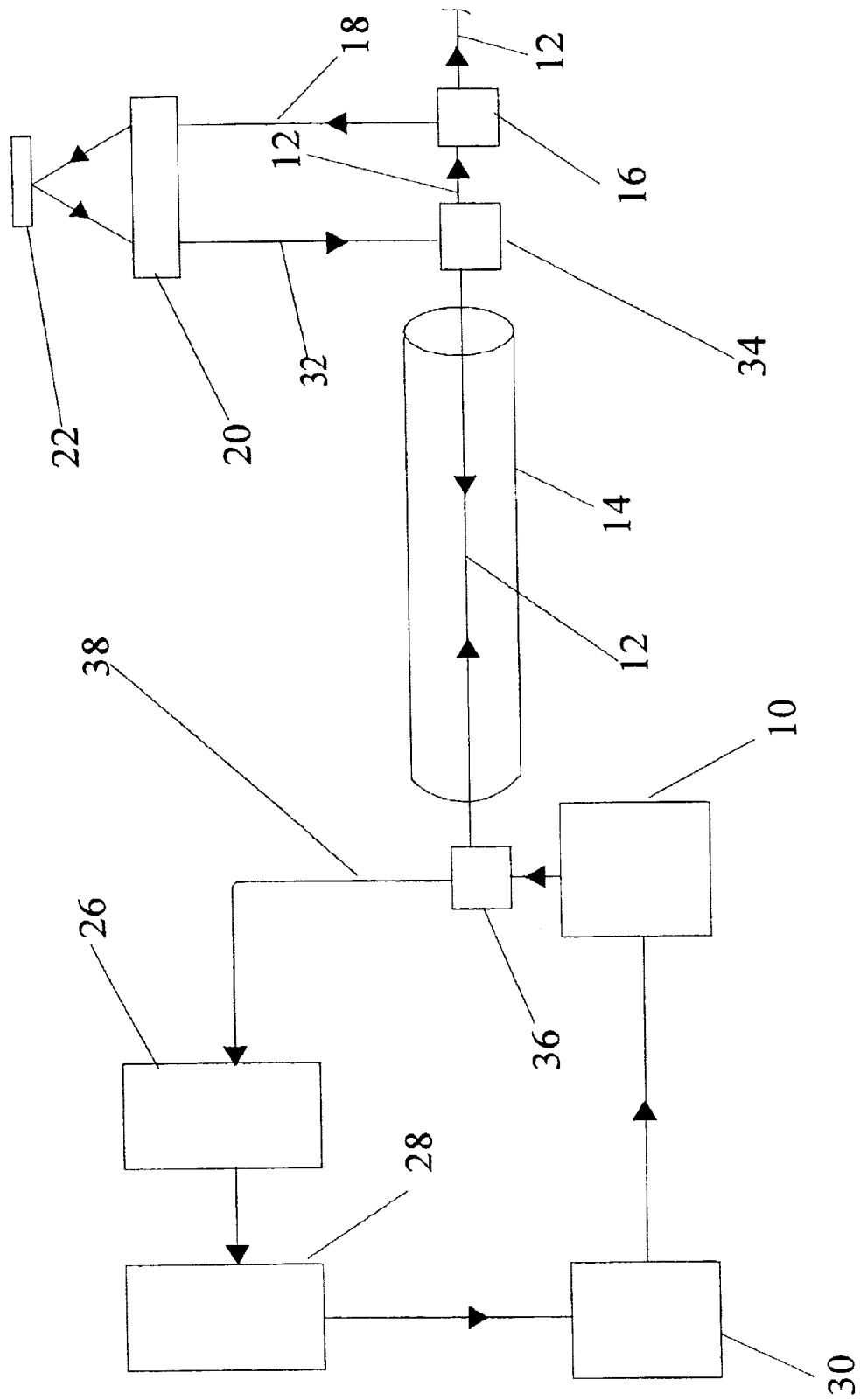
FIG. 2 is a schematic diagram of a second embodiment of the invention wherein the return fibre optic is replaced by dual function of the transmission fibre optic.

Attention is now drawn to FIG. 2, showing an alternative embodiment of the invention where the return optical path includes the transmission fibre optic 12.

All numbers refer to the same elements as in FIG. 1.

Instead of being returned to the photo-detector via the return fibre optic 24, the second coupler 20 sends the return laser light into a second coupling fibre optic 32 which is the input to a third coupler 34. The third coupler 34 is situated on the transmission fibre optic 12 between the optical supply line 14 and the first coupler 16. The third coupler 34 allows through passage of transmitted laser light from the laser source 10 and couples the return laser light, from the second coupling fibre optic 32, back down the transmission fibre optic 12 towards the laser source 10.

Situated between the laser source and the optical supply line 14 is a fourth coupling 36, which allows through passage of the transmitted laser light from the laser source 10, but diverts the return laser light, send back down the transmission fibre optic 12 by the third coupling 34, onto a third coupling fibre optic 38 which provides the return laser light to the photo detector 26. In this instance, the return laser light path also incorporates the transmission fibre optic 12, used in reverse.

The example of FIG. 2 is appropriate to situations where the optical supply line 14 is relatively short. Where the optical supply line becomes long (greater, for example, than 4 kilometers) the back-scattered light from the transmission fibre optic 12 can become sufficiently intense to provide a false "hold on" signal. Where this is the case, the embodiment of FIG. 1 is preferred.

FIG. 1 and FIG. 2 have shown the first coupling 16 being disposed, for preference, at the remote end of the optical supply line 14 so that the entire length of the optical supply line 14 can be protected. This is very appropriate for medical, surgical and light industrial applications, where persons are in intimate proximity to the supply line 14, as well as in industrial applications where the first coupler 16 is, ideally, as close as possible to the tool head. The present invention also envisages the location of the first coupler 16 being other than at the remote end of the optical supply line 14. In oil fields, optical supply lines 14 are fed for many kilometers, and then down a well. The first coupler 16 can, conveniently, be placed at the wellhead, any residual optical supply 14 line being down the well and unable to cause damage or injury if broken. Equally, an area or room from which an optical supply line 14 is fed can have the first coupler 16 provided at the boundary of the area or room to create a safe zone.

Figure 3:
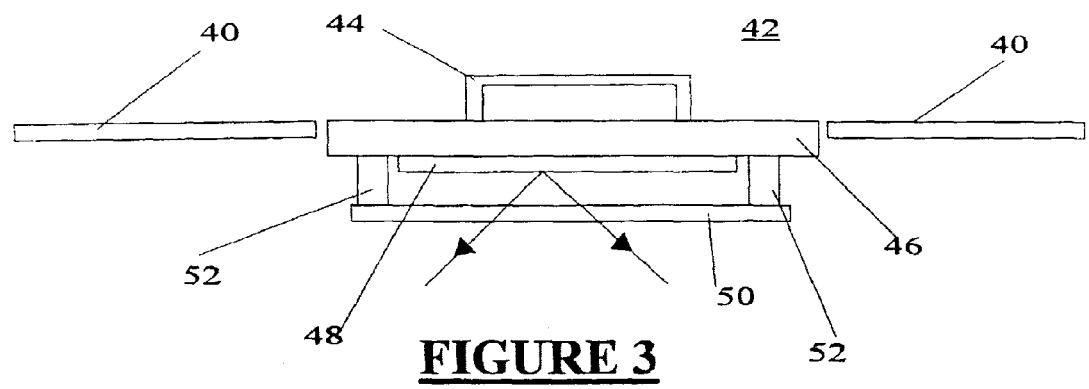
FIG. 3 is a cross-sectional view of a removable key employing a reflector and an optical filter.

Attention is now drawn to FIG. 3, showing a cross section of a possible removable key, according to the present invention.

The surface of a housing 40, enclosing at least the second coupler 20 and, for preference, the first coupler 16, supports and surrounds a removable, reflective key 42, corresponding to the reflective element 22 of FIG. 1 and FIG. 2. A base 46 has a handle 44 whereby the key 42 can be inserted into or removed from the housing 40. On the interior side of the base 46 a reflector 48 acts to reflect the return laser light to and from the second coupler 20. A first optical filter 50 is supported by pillars 52 to cover at least a portion of the face of the reflector 48. The first optical filter 50 is a band pass filter, allowing through passage only of a predetermined wavelength of return laser light, Because the first optical filter 50 is across the reflective face of the reflector 48, the reflector 48 is reflective only at the predetermined wavelength. The predetermined wavelength is the wavelength of laser light transmitted from the laser source. When the key 42 is inserted, as shown, the return optical path is completed, and the laser source 10 can be operated. When the key 42 is removed from the housing 40, the return optical path is interrupted and the laser source is held extinguished. Because of the first optical filter being band pass at the wavelength of the laser source 10, the return optical path cannot be completed with a key for another laser source. The key 42 is thus a security measure for safety during maintenance. Maintenance personnel simply have to remove and retain the key 42 to be assured against accidental or careless activation of the laser source 10. By the simple expedient of controlling possession of the key 42, it also becomes possible to control use of the system. With no key 42, there is no use of the laser source 10.

Figure 4:
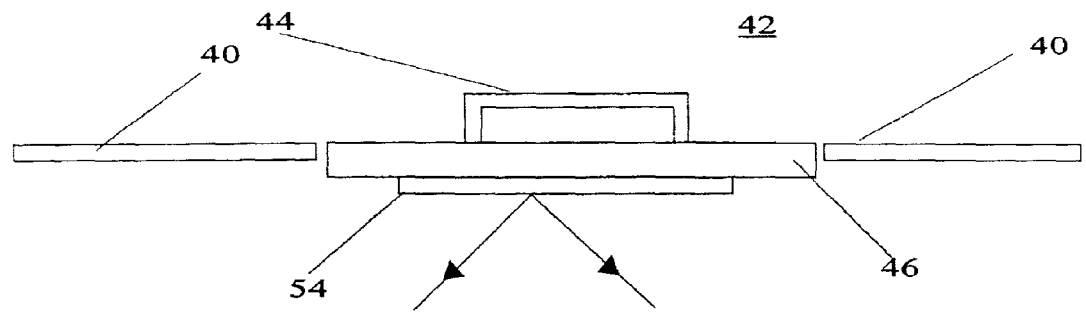
FIG. 4 is a cross sectional view of an exemplary removable key employing a Bragg grating.

Attention is now drawn to FIG. 4, showing a key 42 where the first optical filter 50 is omitted, but which serves the same purpose by substituting a Bragg grating 54 in place of the reflector 48. A Bragg grating will reflect a wavelength of light at an angle which is determined by the spacing of the reflective elements in its material. A Bragg grating, therefore, acts as a monochromatic mirror for a particular angle of incidence of light. In the example of FIG. 4, the angle of light incidence and the grating 54 made such that the predetermined wavelength is reflected as the return laser light. The embodiment of FIG. 4 thus achieves the same as the embodiment of FIG. 3, but omitting the first optical filter 48.

The invention also allows that the key 42 need not be monochromatic. The invention further allows that the reflector 48 of FIG. 3 can be replaced by the Bragg grating 54 of FIG. 4, still retaining the first optical filter 50 to achieve even tighter bandwidth control.

Figure 5:
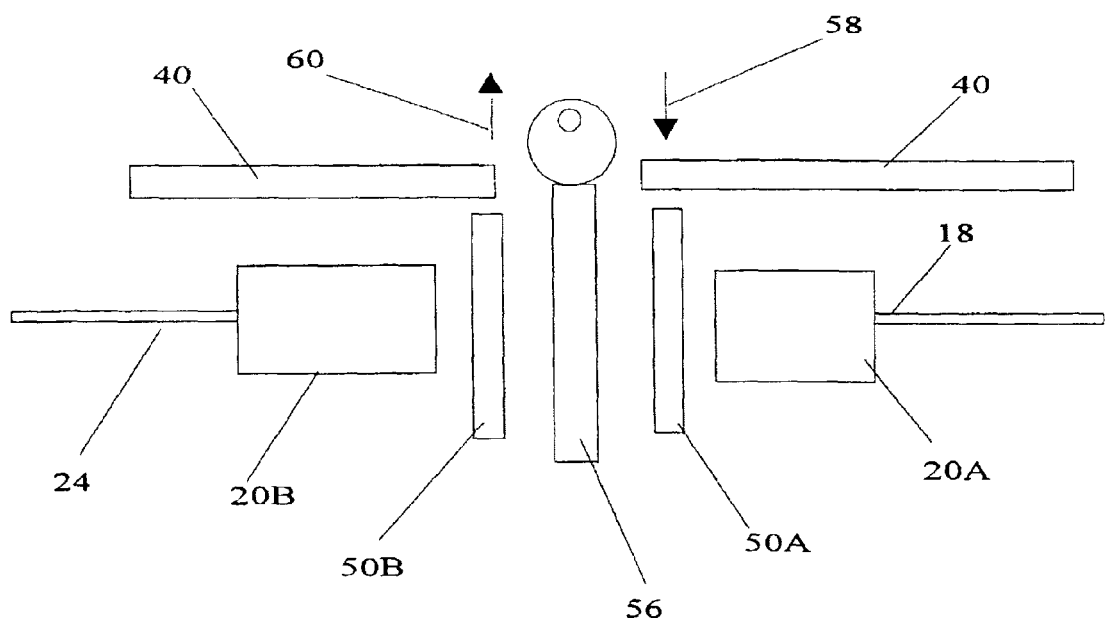
FIG. 5 is a cross sectional view of an exemplary removable key, of a simple form, which also conforms to the invention.

Attention is now drawn to FIG. 5, showing a cross section of a simple, removable key, which acts as an interruption element to the return laser light and which does not require a reflective element 22 48 54.

A simple shutter 56 fits into a slot in the housing 40, being inserted as indicated by a first arrow 58 and removed as indicated by a second arrow 60, to sit between a second optical filter 50A and a third optical filter 50B, each monochromatic at the wavelength of the laser source 10. The second coupler 20 is split into a first part 20A which accepts return laser light from the first coupling fibre optic 18 (seen in FIG. 1), and directs it through the second 50A and third 50B optical filters onto a second part 20B which sends the return laser light into the return fibre optic (seen in FIG. 1) unless interrupted by the shutter 56. The shutter 56 can be supplied with a simple mechanical locking key (shown schematically) which can be used to lock the shutter 56 in place when safety or prohibition of use is required.

An even simpler kind of interruption or completion device, not shown because of its simplicity, is also possible. The first coupling fibre optic 18 is affixed to the return fibre optic 24 by a mechanically releasable connector. When the connector is released, the laser source 10 is extinguished and all is shut down, When the connector is re-connected, the laser source 10 can be operated again.

Neither the example of FIG. 5. nor the above described example, have the a wavelength selective key 42 having same utility as the examples of FIGS. 3 and 4. They are, none the less, within the scope of the invention.

In the examples thus far given, the key 42 56 has been shown disposed in proximity to the first coupler 16. It is to be appreciated that the present invention permits the key 48 56 to be disposed at any point in the return light path.

Figure 6:
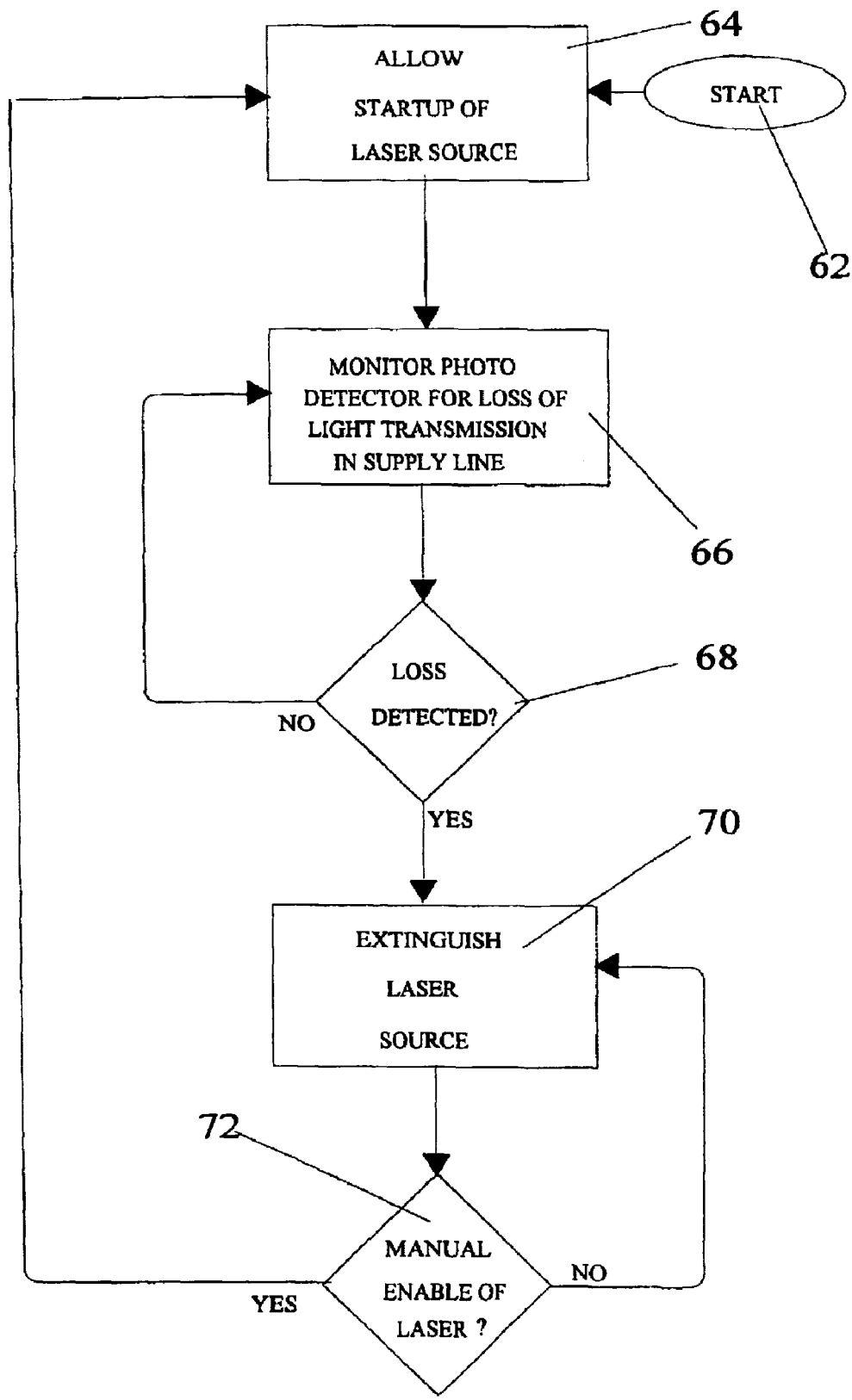
FIG. 6 is a flowchart of the activities of the monitor and controller of FIGS. 1 and 2.

Attention is finally drawn to FIG. 6, showing a flow chart of the combined activities of the photo detector 26, the monitor 28 and the controller 30.

From switch on 62 of the three elements 26 28 30, as the laser source is energised, control passes to a first operation 64 which allows start up of the laser source 10. The monitoring and extinguishing activity is suspended for a very brief period after the laser source 10 is switched on to enable the system to stabilise. This period is short enough to avoid damage or injury should the supply line 14 be fractured or broken. Thereafter, control passes to a second operation 66 where the monitor 28 monitors the output of the photo detector 26 to see if a loss or return laser light is present.

In a first manner of operation, the monitor 28 can simply compare the output of the photo detector 26 with a predetermined level. A first test 68 detects a loss of transmission of laser light if the output of the photo detector 26 falls below the predetermined level.

In a second manner of operation, the monitor 28 compares the instantaneous or short term average output of the photo detector 26 with the long term average value of the output of the photo detector 26. If the short term average falls below a predetermined proportion of the long term average, the first test 68 detects a loss of transmission of laser light in the supply line 14. This manner of operation is of particular use with pulsed or modulated laser sources 10. The generation of the short and long term averages can be accomplished in the photo detector 26, in the monitor 28, or the task split between the two 26 28.

In a third manner of operation, the monitor 28 looks at the rate of change of the output of the photo detector 26. For a pulsed or modulated laser source 10, this can be a short term average of the rate of change, far slower than the pulse rate or the modulation rate, but fast enough to ensure extinction of the laser source 10 should the first test 68 detect a loss of transmission of laser light in the optical supply line 14. Should the rate of change of the output of the photo detector 26 exceed a predetermined limit, the first test 68 detects a loss of transmission.

In a fourth manner of operation, particularly applicable to pulsed laser sources 10, the monitor 28 can be gated by the laser source 10 only when the laser source 10 is firing, so that intermediate periods of no return laser light are ignored.

The monitor 28 can, simultaneously, use one, all or some of these manners of operation.

If the first test 68 has detected no loss of transmission, control continues with the second operation 66. If the first test 68 has detected a loss of transmission, control passes to a third operation 70 wherein the output of the monitor 28 causes the controller 30 to extinguish the laser source 10 in any of the manners herein before described.

The third operation 70 maintains the laser source 10 extinguished until a second test 72 detects that a manual enable (such as a reset button) has deliberately been momentarily applied to restart the laser source 10. Control then passes back to the first operation 64. If there is, indeed, a break in transmission, the second operation 66, the first test 68 and the third operation 70 will quickly quench the laser source 10 before any damage has been done. The laser source 10 will only then re-start on further intervention by the manual enable (reset button). If there is no fault, the laser source 10 will restart and continue to operate.

The invention has, thus far, been described and explained by way of examples. The invention is further explained by the following claims.

The invention claimed is:

1. An optical supply apparatus comprising:
   a laser source;
   an optical supply path for guiding laser light from the laser source;

a first coupler disposed along the optical supply path at a position remote from the laser source for receiving the guided laser light and sampling at least a portion of the guided light;

an optical return path for guiding the sampled light from the first coupler to a detection assembly in communication with the laser source, the detection assembly comprising:

a photo detector disposed along the optical return path, the photo detector adapted to detect the intensity of the sampled laser light in the optical return path, and to provide an output indicative of the intensity therein;

circuitry for receiving the output of the sampled laser light intensity from the photo detector and providing an output indicative of transmission loss from the transmitted laser light in the optical supply path; and a controller for receiving the output indicative of the transmission loss from the laser light in the optical supply path from the circuitry, and selectively extinguishing the laser source based on a predetermined reference for transmission loss; and a removable key disposed along the optical return path, the key being selectively operable to interrupt the guidance of the sampled light through the optical return path to the detection assembly.

2. The optical supply apparatus of claim 1, wherein the output from the photo detector is also indicative of at least one of:

the guided laser light in said optical supply path having fallen below a predetermined level;

the guided laser light in said optical supply path having fallen below a predetermined proportion of its mean level; and the guided laser light in said optical supply path having fallen in intensity at more than a predetermined rate.

3. The optical supply apparatus of claim 1, wherein the removable key, comprises an optical filter, reflector or Bragg grating.

4. The optical supply apparatus of claim 1, wherein the optical return path comprises a fiber optic.

5. The optical supply apparatus of claim 1, further comprising a second coupler disposed along the optical return path to provide light to the photo detector at a predetermined intensity.

6. The optical supply apparatus of claim 1, wherein the removable key comprises a Bragg Grating.

7. The optical supply apparatus of claim 2, further comprising a second coupler disposed along the optical return path to provide light to the photo detector at a predetermined wavelength.

8. The optical supply apparatus of claim 7, wherein the predetermined wavelength is substantially equal to the wavelength of the guided laser light from the laser source.

9. A method for transmitting laser light comprising:

activating a laser source to provide a laser light;

guiding the laser light from the laser source through an optical supply path;

receiving the guided laser light and sampling at least a portion of the guided light using a first coupler disposed along the optical supply path at a position remote from the laser source;

guiding the sampled light through an optical return path from the first coupler to a detection assembly in communication with the laser source, the detection assembly comprising:

a photo detector disposed along the optical return path, the photo detector adapted to detect the intensity of the sampled laser light in the optical return path, and to provide an output indicative of the intensity therein;

circuitry for receiving the output of the sampled laser light intensity from the photo detector and providing an output indicative of transmission loss from the transmitted laser light in the optical supply path; and a controller for receiving the output indicative of the transmission loss from the laser light in the optical supply path from the circuitry, and selectively extinguishing the laser source based on a predetermined reference for transmission loss; and selectively operating a removable key disposed along the optical return path, the key being selectively operable between a first position and a second position to interrupt the guidance of the sampled light through the optical return path to the detection assembly.

10. The method of claim 9, further comprising extinguishing the laser source when the transmission loss from the transmitted laser light in the optical supply path is less than 0.1%.

11. The method of claim 9, further comprising moving the key from the first position to the second position to disable the laser source.

12. The method of claim 9, further comprising providing light to the photo detector at a predetermined intensity through a second coupler disposed along the optical return path.

13. The method of claim 12, wherein the predetermined wavelength is substantially equal to the wavelength of the guided laser light from the laser source.

14. The method of claim 9, wherein the optical supply path is the same path as the optical return path.

15. The method of claim 10, wherein the laser source is extinguished by moving the key from the first position to the second position.

* * * * *